(12) United States Patent
Shao et al.

(10) Patent No.: US 8,821,985 B2
(45) Date of Patent: Sep. 2, 2014

(54) METHOD AND APPARATUS FOR HIGH-K GATE PERFORMANCE IMPROVEMENT AND COMBINATORIAL PROCESSING

(71) Applicant: Intermolecular, Inc., San Jose, CA (US)

(72) Inventors: ShouQian Shao, Fremont, CA (US);
Chi-I Lang, Cupertino, CA (US);
Sandip Niyogi, San Jose, CA (US);
Jinhong Tong, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/667,986

(22) Filed: Nov. 2, 2012

(65) Prior Publication Data

US 2014/0127422 A1 May 8, 2014

(51) Int. Cl.
*B05D 3/00* (2006.01)
*H05H 1/00* (2006.01)

(52) U.S. Cl.
USPC ............................ 427/532; 427/535; 427/552

(58) Field of Classification Search
None
See application file for complete search history.

(56) References Cited

U.S. PATENT DOCUMENTS

| 6,362,085 | B1 | 3/2002 | Yu et al. |
| 7,902,018 | B2 | 3/2011 | Kraus et al. |
| 2004/0121620 | A1* | 6/2004 | Pomarede et al. ............ 438/785 |
| 2006/0196421 | A1 | 9/2006 | Ronsse et al. |
| 2008/0076268 | A1 | 3/2008 | Kraus et al. |
| 2009/0061083 | A1* | 3/2009 | Chiang et al. ............. 427/248.1 |
| 2009/0068849 | A1* | 3/2009 | Endo et al. ................... 438/763 |
| 2009/0275210 | A1* | 11/2009 | Shanker et al. .............. 438/761 |

OTHER PUBLICATIONS

Xia et al., "Combinatorial CVD of Zirconium, Hafnium, and Tin Dioxide Mixtures for Applications as High-K Materials", Chem. Vap. Deposition 2004, 10, No. 4, p. 195-200.*

* cited by examiner

*Primary Examiner* — Timothy Meeks
*Assistant Examiner* — Ina Agaj

(57) ABSTRACT

Methods and apparatuses for combinatorial processing are disclosed. Methods include introducing a substrate into a processing chamber. Methods further include forming a first film on a surface of a first site-isolated region on the substrate and forming a second film on a surface of a second site-isolated region on the substrate. The methods further include exposing the first film to a plasma having a first source gas to form a first treated film on the substrate and exposing the second film to a plasma having a second source gas to form a second treated film on the substrate without etching the first treated film in the processing chamber. In addition, methods include evaluating results of the treated films post processing.

12 Claims, 12 Drawing Sheets

METHOD AND APPARATUS FOR HIGH-K GATE PERFORMANCE IMPROVEMENT AND COMBINATORIAL PROCESSING

FIELD OF THE INVENTION

The present disclosure relates to methods and apparatuses for combinatorial processing using a remote plasma source for treatment and layer formation.

BACKGROUND

Plasmas are widely used for a variety of treatment and layer deposition tasks in semiconductor fabrication. These applications include subtractive processes such as wafer precleaning, contaminant removal, native oxide removal, photoresist removal, plasma etching, as well as additive processes such as deposition, oxidation, nitridation, or hydridation of a layer both during and after formation. "Remote" plasma sources are frequently used where the plasma generator is located some distance from a surface to be treated or substrate on which a layer is to be formed. The distance allows the charged particles in the plasma to be filtered such that the density of electrons and ions may be adjusted.

Heretofore, remote plasma sources have been used to provide uniform exposure for entire substrates and experimental studies of process variables have required dedicating an entire wafer to each process condition to be tested. What is needed is a system that allows systematic exploration of process variables in a combinatorial manner with many variations on a single substrate.

The present invention addresses such a need.

SUMMARY OF THE DISCLOSURE

The following summary is included in order to provide a basic understanding of some aspects and features of the present disclosure. This summary is not an extensive overview of the disclosure and as such it is not intended to particularly identify key or critical elements of the disclosure or to delineate the scope of the disclosure. Its sole purpose is to present some concepts of the disclosure in a simplified form as a prelude to the more detailed description that is presented below.

Methods and apparatuses for combinatorial processing are disclosed. Methods include introducing a substrate into a processing chamber. Methods further include forming a first film on a surface of a first site-isolated region on the substrate and forming a second film on a surface of a second site-isolated region on the substrate. The methods further include exposing the first film to a plasma having a first source gas to form a first treated film on the substrate and exposing the second film to a plasma having a second source gas to form a second treated film on the substrate without etching the first treated film in the processing chamber. In addition, methods include evaluating results of the treated films post processing.

In some embodiments, methods include introducing a substrate into a processing chamber. Methods further include directing a first reactant into a processing chamber. Methods include removing excess first reactant from the processing chamber. The methods further include utilizing a remote plasma source to create a plasma wherein the plasma is a second reactant. Further, introducing a treating material into the second reactant. In addition, directing the second reactant into the processing chamber wherein the second reactant reacts with the first reactant to deposit a monolayer on the surface of a substrate within the processing chamber.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale. The techniques of the present disclosure may readily be understood by considering the following detailed description in conjunction with the accompanying drawings, in which.

DETAILED DESCRIPTION

Figure 1:
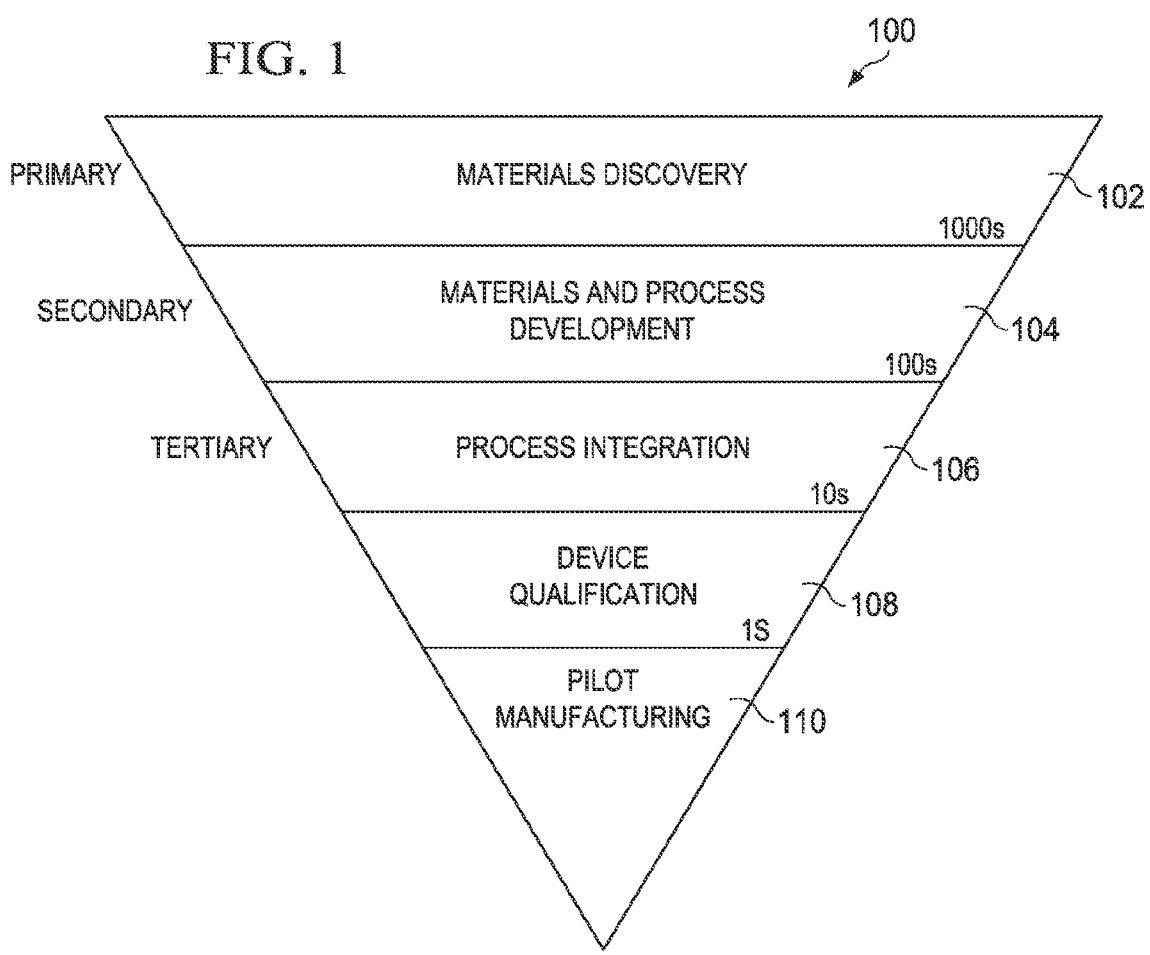
FIG. 1 is a schematic diagram for implementing combinatorial processing and evaluation.

Methods and apparatuses for combinatorial processing are disclosed. Methods include introducing a substrate into a processing chamber. Methods further include forming a first film on a surface of a first site-isolated region on the substrate and forming a second film on a surface of a second site-isolated region on the substrate. The methods further include exposing the first film to a plasma having a first source gas to form a first treated film on the substrate and exposing the second film to a plasma having a second source gas to form a second treated film on the substrate without etching the first treated film in the processing chamber. In addition, methods include evaluating results of the treated films post processing.

It is to be understood that unless otherwise indicated this disclosure is not limited to specific layer compositions or surface treatments. It is also to be understood that the terminology used herein is for the purpose of describing particular embodiments only and is not intended to limit the scope of the present disclosure.

It must be noted that as used herein and in the claims, the singular forms "a," and "the" include plural referents unless the context clearly dictates otherwise. Thus, for example, reference to "a layer" also includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the disclosure. The upper and lower limits of these smaller ranges may independently be included in the smaller ranges, and are also encompassed within the disclosure, subject to any specifically excluded limit in the stated range. Where the stated range includes one or both of the limits, ranges excluding either or both of those included limits are also included in the disclosure. The term "about" generally refers to ±10% of a stated value.

The term "site-isolated" as used herein refers to providing distinct processing conditions, such as controlled temperature, flow rates, chamber pressure, processing time, plasma composition, and plasma energies. Site isolation may provide complete isolation between regions or relative isolation between regions. Preferably, the relative isolation is sufficient to provide a control over processing conditions within ±10%, within ±5%, within ±2%, within ±1%, or within ±0.1% of the target conditions. Where one region is processed at a time, adjacent regions are generally protected from any exposure that would alter the substrate surface in a measurable way.

The term "site-isolated region" is used herein to refer to a localized area on a substrate which is, was, or is intended to be used for processing or formation of a selected material. The region may include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

The term "substrate" as used herein may refer to any workpiece on which formation or treatment of material layers is desired. Substrates may include, without limitation, silicon, coated silicon, other semiconductor materials, glass, polymers, metal foils, etc. The term "substrate" or "wafer" may be used interchangeably herein. Semiconductor wafer shapes and sizes may vary and include commonly used round wafers of 2", 4", 200 mm, or 300 mm in diameter.

The term "high-k dielectric" as used herein may refer to a variety of compositions that are homogenous, heterogeneous, graded and/or multiple films or layered stacks or laminates. High-k dielectric material may include combinations of hafnium, zirconium, titanium, tantalum, lanthanum, aluminum, silicon, oxygen and/or nitrogen. High-k dielectric materials may include silicon oxynitrides ($SiO_xN_y$), hafnium containing materials, such as hafnium oxides ($HfO_x$ including $HfO_2$), hafnium silicates ($HfSi_xO_y$ including $HfSiO_4$), hafnium, silicon oxynitrides ($HfSi_xO_yN_z$), hafnium oxynitrides ($HfO_xN_y$), hafnium aluminates ($HfAl_xO_y$), hafnium aluminum silicates ($HfAl_xSi_yO_z$), hafnium aluminum silicon oxynitrides ($HfAl_wSi_xO_yN_z$), hafnium lanthanum oxides ($HfLa_xO_y$), zirconium containing materials, such as zirconium oxides ($ZrO_x$ including $ZrO_2$), zirconium silicates ($ZrSi_xO_y$ including $ZrSiO_4$), zirconium silicon oxynitrides ($ZrSi_xO_yN_z$), zirconium oxynitrides ($ZrO_xN_y$), zirconium aluminates ($ZrAl_xO_y$), zirconium aluminum silicates ($ZrAl_xSi_yO_z$), zirconium aluminum silicon oxynitrides ($ZrAl_wSi_xO_yN_z$), zirconium lanthanum oxides ($ZrLa_xO_y$), other aluminum-containing materials or lanthanum-containing materials, such as aluminum oxides ($Al_2O_3$ or $AlO_x$), aluminum oxynitrides ($AlO_xN_y$), aluminum silicates ($AlSi_xO_y$), aluminum silicon oxynitrides ($AlSi_xO_yN_z$), lanthanum aluminum oxides ($LaAl_xO_y$), lanthanum oxides ($LaO_x$ or $La_2O_3$), other suitable materials, composites thereof, and combinations thereof. Other high-k dielectric materials useful for dielectric layers may include titanium oxides ($TiO_x$ or $TiO_2$), titanium oxynitrides ($TiO_xN_y$), tantalum oxides ($TaO_x$ or $Ta_2O_5$) and tantalum oxynitrides ($TaO_xN_y$). Laminate films that are useful dielectric materials for high-k dielectric layers include $HfO_2/Al_2O_3$, $HfO_2/SiO_2$, $La_2O_3/Al_2O_3$ and $HfO_2/SiO_2/Al_2O_3$.

The term "remote plasma source" as used herein refers to a plasma generator (e.g., an rf or microwave plasma generator) located at a distance from a deposition or treatment location sufficient to allow some filtering of the plasma components. For example, the density of ions and electrons may be adjusted by distance, and electrons and ions may also be filtered using suitable electrode configurations, such as a grounded metal showerhead so that only atomic or molecular radicals reach the substrate.

It is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This may greatly improve both the speed and reduce the costs associated with the discovery, implementation, optimization, and qualification of material(s), process(es), and process integration sequence(s) required for manufacturing.

Systems and methods for HPC™ processing are described in U.S. Pat. No. 7,544,574 filed on Feb. 10, 2006; U.S. Pat. No. 7,824,935 filed on Jul. 2, 2008; U.S. Pat. No. 7,871,928 filed on May 4, 2009; U.S. Pat. No. 7,902,063 filed on Feb. 10, 2006; and U.S. Pat. No. 7,947,531 filed on Aug. 28, 2009 which are all herein incorporated by reference for all purposes. Systems and methods for HPC™ processing are further described in U.S. patent application Ser. No. 11/352,077 filed on Feb. 10, 2006, claiming priority from Oct. 15, 2005; U.S. patent application Ser. No. 11/419,174 filed on May 18, 2006, claiming priority from Oct. 15, 2005; U.S. patent application Ser. No. 11/674,132 filed on Feb. 12, 2007, claiming priority from Oct. 15, 2005; and U.S. patent application Ser. No. 11/674,137 filed on Feb. 12, 2007, claiming priority from Oct. 15, 2005 which are all herein incorporated by reference for all purposes.

HPC™ processing techniques have been successfully adapted to wet chemical processing such as etching, texturing, polishing, cleaning, etc. HPC™ processing techniques have also been successfully adapted to deposition processes such as physical vapor deposition (PVD) (i.e. sputtering), atomic layer deposition (ALD), and chemical vapor deposition (CVD).

In addition, systems and methods for combinatorial processing and further described in U.S. patent application Ser. No. 13/341,993 filed on Dec. 31, 2011 and U.S. patent application Ser. No. 13/302,730 filed on Nov. 22, 2011 which are all herein incorporated by reference for all purposes.

HPC™ processing techniques have been adapted to the development and investigation of absorber layers and buffer layers for TFPV solar cells as described in U.S. patent application Ser. No. 13/236,430 filed on Sep. 19, 2011, entitled "COMBINATORIAL METHODS FOR DEVELOPING SUPERSTRATE THIN FILM SOLAR CELLS" and is incorporated herein by reference for all purposes.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages may be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e. microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes may proceed to pilot manufacturing 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from HPC™ techniques described in U.S. patent application Ser. No. 11/674,137 filed on Feb. 12, 2007 which is hereby incorporated for reference for all purposes. Portions of the '137 application have been reproduced below to enhance the understanding of the present disclosure.

While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete site-isolated region. Furthermore, while different materials or unit processes may be used for corresponding layers or steps in the formation of a structure in different site-isolated regions of the substrate during the combinatorial processing, the application of each layer or use of a given unit process is substantially consistent or uniform throughout the different site-isolated regions in which it is intentionally applied. Thus, the processing is uniform within a site-isolated region (inter-region uniformity) and between site-isolated regions (intra-region uniformity), as desired. It should be noted that the process may be varied between site-isolated regions, for example, where a thickness of a layer is varied or a material may be varied between the site-isolated regions, etc., as desired by the design of the experiment.

The result is a series of site-isolated regions on the substrate that contain structures or unit process sequences that have been uniformly applied within that site-isolated region and, as applicable, across different site-isolated regions. This process uniformity allows comparison of the properties within and across the different site-isolated regions such that the variations in test results are due to the varied parameter (e.g., materials, unit processes, unit process parameters, hardware details, or process sequences) and not the lack of process uniformity. In the embodiments described herein, the positions of the discrete site-isolated regions on the substrate may be defined as needed, but are preferably systematized for ease of tooling and design of experimentation. In addition, the number, variants and location of structures within each site-isolated region are designed to enable valid statistical analysis of the test results within each site-isolated region and across site-isolated regions to be performed.

Figure 2:
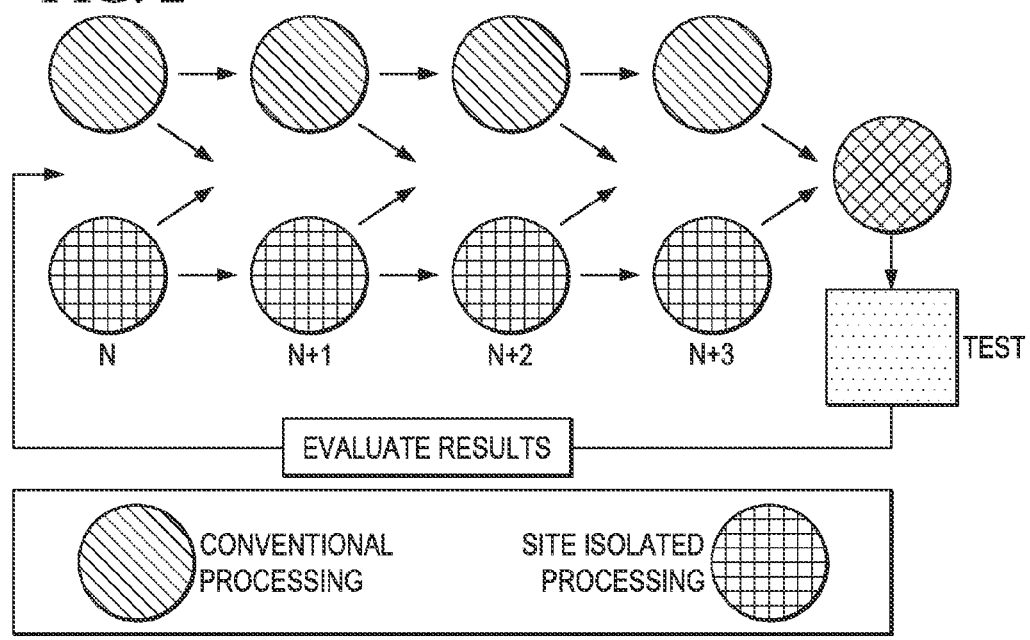
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing. In some embodiments, the substrate is initially processed using conventional process N. In some exemplary embodiments, the substrate is then processed using site isolated process N+1. During site isolated processing, an HPC™ module may be used, such as the HPC module described in U.S. patent application Ser. No. 11/352,077 filed on Feb. 10, 2006, which is incorporated herein by reference for all purposes. The substrate may then be processed using site isolated process N+2, and thereafter processed using conventional process N+3. Testing is performed and the results are evaluated. The testing may include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence may include processing the substrate using site isolated process N, conventional processing for processes N+1, N+2, and N+3, with testing performed thereafter.

It should be appreciated that various other combinations of conventional and combinatorial processes may be included in the processing sequence with regard to FIG. 2. That is, the combinatorial process sequence integration may be applied to any desired segments and/or portions of an overall process flow. Characterization, including physical, chemical, acoustic, magnetic, electrical, optical, etc. testing, may be performed after each process operation, and/or series of process operations within the process flow as desired. The feedback provided by the testing is used to select certain materials, processes, process conditions, and process sequences and eliminate others. Furthermore, the above flows may be applied to entire monolithic substrates, or portions of monolithic substrates such as coupons.

Under combinatorial processing operations the processing conditions at different site-isolated regions may be controlled independently. Consequently, process material amounts, reactant species, processing temperatures, processing times, processing pressures, processing flow rates, processing powers, processing reactant compositions, the rates at which the reactions are quenched, deposition order of process materials, process sequence steps, hardware details, etc., may be varied from site-isolated region to site-isolated region on the substrate. Thus, for example, when exploring materials, a processing material delivered to a first and second site-isolated regions may be the same or different. If the processing material delivered to the first site-isolated region is the same as the processing material delivered to the second isolated-region, this processing material may be offered to the first and second site-isolated regions on the substrate at different concentrations. In addition, the material may be deposited under different processing parameters. Parameters which may be varied include, but are not limited to, process material amounts, reactant species, processing temperatures, processing times, processing pressures, processing flow rates, processing powers, processing reactant compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used may be varied.

As mentioned above, within a site-isolated region, the process conditions are substantially uniform. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. However, in some embodiments, the processing may result in a gradient within the site-isolated regions. It should be appreciated that a site-isolated region may be adjacent to another site-isolated region in some embodiments or the site-isolated regions may be isolated and, therefore, non-overlapping. When the site-isolated regions are adjacent, there may be a slight overlap wherein the materials or precise process interactions are not known, however, a portion of the site-isolated regions, normally at least 50% or more of the area, is uniform and all testing occurs within that site-isolated region. Further, the potential overlap is only allowed with material of processes that will not adversely affect the result of the tests. Both types of site-isolated regions are referred to herein as site-isolated regions or discrete site-isolated regions.

Substrates may be a conventional round 200 mm, 300 mm, or any other larger or smaller substrate/wafer size. In some embodiments, substrates may be square, rectangular, or any other shape. One skilled in the art will appreciate that substrate may be a blanket substrate, a coupon (e.g., partial wafer), or even a patterned substrate having predefined site-isolated regions. In some other embodiments, a substrate may have site-isolated regions defined through the processing described herein.

Software is provided to control the process parameters for each wafer for the combinatorial processing. The process parameters comprise selection of one or more source gases for the plasma generator, plasma filtering parameters, exposure time, substrate temperature, power, frequency, plasma generation method, substrate bias, pressure, gas flow, or combinations thereof.

Plasmas are widely used for a variety of treatment and layer deposition tasks in semiconductor fabrication. These applications include subtractive processes such as wafer precleaning, contaminant removal, native oxide removal, photoresist removal, as well as additive processes such as deposition, oxidation, nitridation, or hydridation of a layer both during and after formation. "Remote" plasma sources are frequently used, where the plasma generator is located at some distance from the surface to be treated or substrate on which a layer is to be formed. The distance allows filtering of the charged particles in the plasma. For example, the density of ions and electrons may be adjusted by distance. The electrons and ions may be removed from the generated plasma using suitable electrode configurations such as a grounded metal showerhead, so that, for example, only atomic radicals and molecule radicals (but not ions) reach the substrate.

The plasma generator for a remote plasma source may use any known means of applying energy to atoms or molecules to ionize them and create a plasma. The energy source may be, for example, electromagnetic energy such as microwaves or radio frequency energy or lasers.

Conventional systems using remote plasma sources were designed to treat the entire area of a substrate such as a 300 mm wafer. Combinatorial processing is difficult and expensive when the entire area of a substrate may only receive a single process variation. Embodiments of the present disclosure overcome this limitation by providing a remote plasma source, an associated substrate positioning system, and a site isolation system that allows a selected site-isolated region of a substrate to be processed while the remaining site-isolated regions of the substrate are protected from exposure to the plasma and reactive radical species unless or until such exposure is intended.

Figure 3:
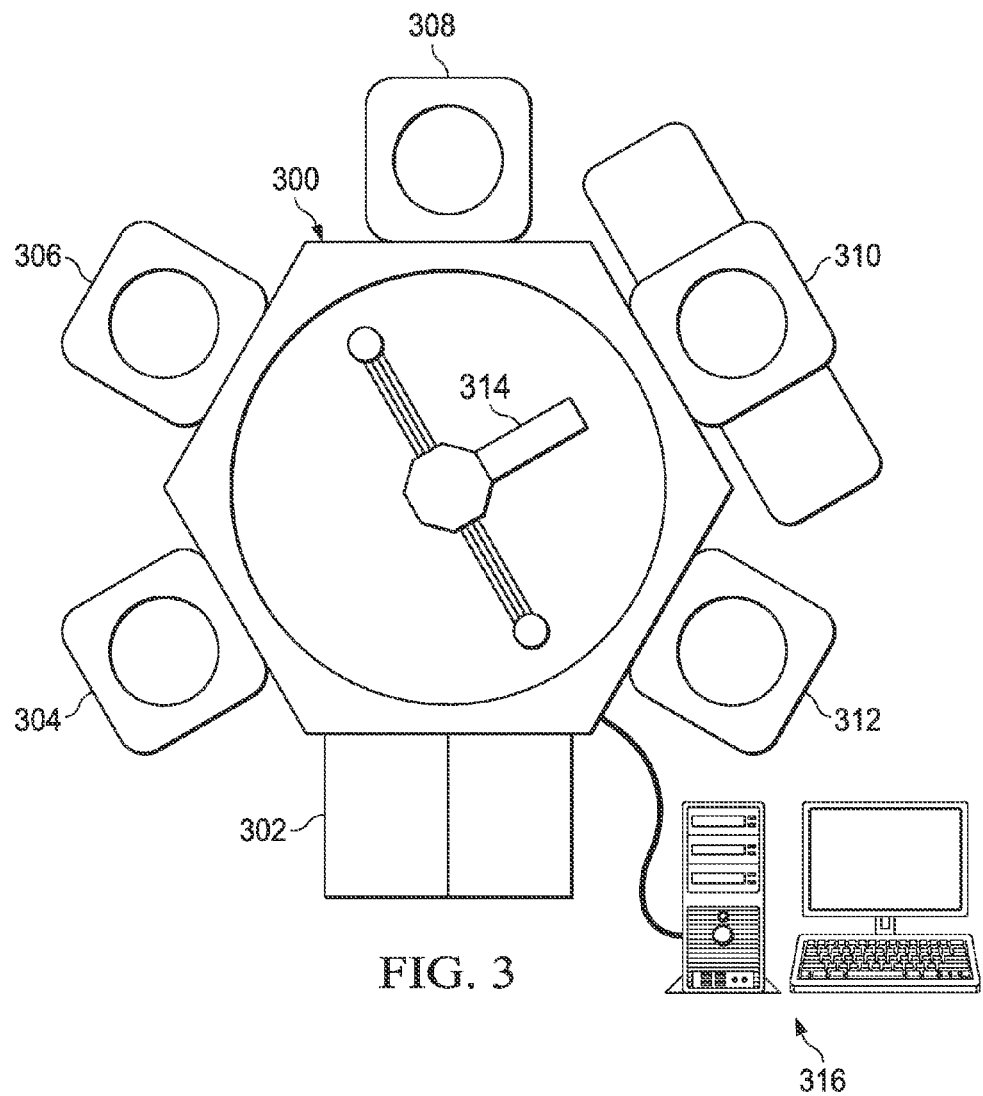
FIG. 3 is a simplified schematic diagram illustrating an integrated high productivity combinatorial (HPC) system.

FIG. 3 is a simplified schematic diagram illustrating an integrated high productivity combinatorial (HPC) system. The HPC system includes a frame 300 supporting a plurality of processing modules. It will be appreciated that frame 300 may be a unitary frame in accordance with some embodiments. In some embodiments, the environment within frame 300 is controlled. A load lock 302 provides access into the plurality of modules of the HPC system. A robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that may be supported to combine combinatorial processing or combinatorial plus conventional processing of a substrate or wafer. In some embodiments, a centralized controller, i.e., computing device 316, may control the processes of the HPC system. Further details of one possible HPC system are described in U.S. patent application Ser. Nos. 11/672,473 and 11/672,478, the entire disclosures of which are herein incorporated by reference for all purposes. In a HPC system, a plurality of methods may be employed to deposit material upon a substrate employing combinatorial processes.

Blanket Plasma Treatment

Figure 4:
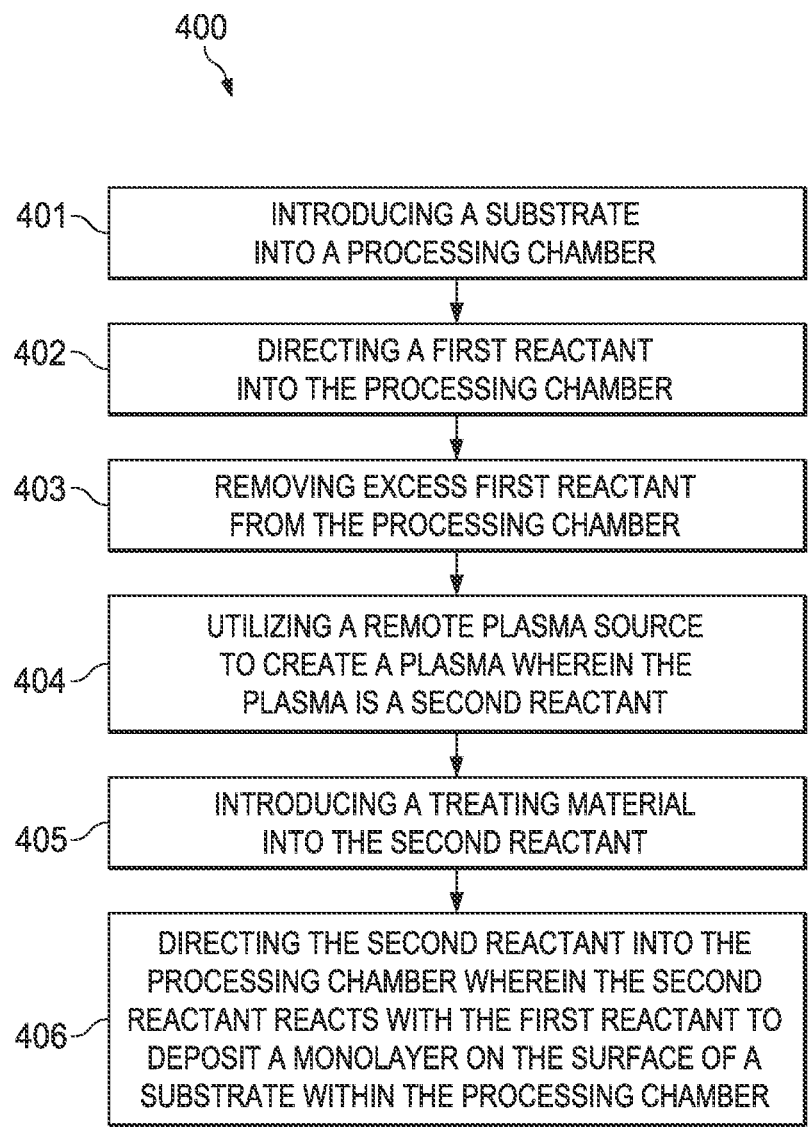
FIG. 4 is a flowchart for blanket deposition methods for treating a film.

FIG. 4 is a flowchart for blanket deposition methods of treating a film. As shown, flowchart 400 starts with block 401. According to block 401, a substrate is introduced into a processing chamber. In some embodiments, the substrate includes a semiconductor material. The processing chamber may be any tool which may provide atomic layer deposition (ALD) and plasma enhanced ALD such as a plasma enhanced ALD tool or an ALD tool with a remote plasma source.

Moving forward, block 402 provides directing a first reactant into the processing chamber. In some embodiments, the first reactant includes a high-k dielectric precursor, including any of the materials described above, to be formed upon the substrate according to an ALD process such as a plasma enhanced ALD process.

Next, block 403 provides removing excess first reactant from the processing chamber. In some embodiments, removing excess first reactant from the processing chamber is accomplished utilizing a vacuum or other gas purging system within the chamber.

Further, block 404 provides utilizing a remote plasma source to create a plasma. In some embodiments, the plasma is a second reactant which will react with the first reactant on the substrate. In some embodiments, the plasma is generated from a remote plasma source coupled to the processing chamber.

Next, block 405 provides introducing a treating material into the second reactant. In some embodiments, the treating materials may be any of a fluorine-containing gas and a nitrogen-containing gas to effect a fluorine or nitrogen treatment, respectively. Further, introducing the treating materials within the second reactant may be considered a doping step serving to introduce a material within the monolayer formed on the substrate according to some embodiments of the present disclosure.

In some embodiments, when the process includes a fluorine treatment, the treating materials may include at least one of $NF_3$, $CF_4$, or $F_2$ gases. Furthermore, in some embodiments when the process includes a nitrogen treatment, the treating materials may include at least one of $N_2$ or $NH_3$ gases. The treating materials may be introduced into the second reactant by various methods as will be further described below.

Further, block 406 provides directing the second reactant into the processing chamber. In some embodiments, the second reactant reacts with the first reactant upon the substrate to form (e.g., deposit) a monolayer on the surface of a substrate within the processing chamber. It should be understood by those having ordinary skill in the art that the aforementioned sequence may be repeated until a desired thickness is achieved.

Figure 5A:
FIGS. 5A-5C show illustrative embodiments of a substrate during various stages of the process sequence referred to in FIG. 4.
Figure 5B:
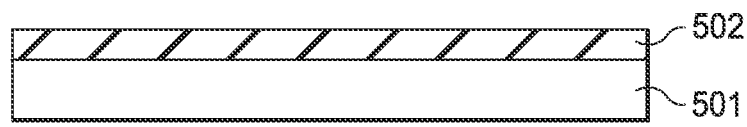
Figure 5C:
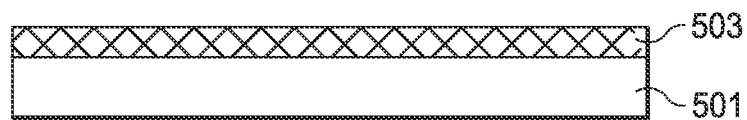

FIGS. 5A-5C shows illustrative embodiments of a substrate during various stages of the process sequence referred to in FIG. 4. FIG. 5A illustrates a substrate 501 which may be introduced into a processing chamber.

FIG. 5B illustrates a substrate 501 upon which a film 502 was formed thereon. In some embodiments, the film 502 is a high-k dielectric film formed by the plasma enhanced ALD process described above (e.g., flowchart 400 of FIG. 4). In some embodiments, the film 502 has a thickness of approximately 3.0 nm.

Moving forward, FIG. 5C illustrates a treated film 503 formed upon a substrate 501. In some embodiments, film 503 is a high-k dielectric film 503 treated with a plasma having a fluorine-containing gas. In some other embodiments, high-k dielectric film 503 is treated with a plasma having a nitrogen-containing gas.

Combinatorial Plasma Treatment

In some embodiments, methods of combinatorially varying surface exposure to a plasma or reactive radical species are provided. The methods comprise exposing a first site-isolated region of a substrate to a plasma or reactive radical species from a remote plasma source under a first set of process parameters and exposing a second site-isolated region of the substrate to a plasma or reactive radical species from a remote plasma source under a second set of process parameters. During plasma exposure, the remaining area (the unexposed area) of the substrate is protected from exposure to the plasma or reactive radicals. The process parameters may be varied in a combinatorial manner. Typically, the process parameters comprise source gases for the plasma generator, plasma filtering parameters, exposure times, gas flow rates, frequencies, plasma generator powers, plasma generation methods, chamber pressures, substrate temperatures, distances between plasma source and substrate, substrate bias voltages, or combinations thereof. The site-isolated region is exposed to a plasma or reactive radical species through a showerhead component within the processing chamber.

The methods may further comprise exposing a third site-isolated region of the substrate to a plasma or reactive radical species from a remote plasma source under a third set of process parameters. The exposing of site-isolated regions of the substrate to a plasma or reactive radical species under different process parameters may be repeated until the desired process parameters have been performed, i.e., by exposing a plurality of site-isolated regions of the substrate to a plasma or reactive radical species from a remote plasma source under a plurality of sets of process parameters. After a desired number of site-isolated regions of the substrate have been exposed to plasma under different processing parameters, the substrate may be analyzed to evaluate the effect of the different process parameters on the substrate.

Process times for exposure to remote plasmas may vary. Typical process times vary from a few seconds to a few minutes. In some embodiments, the process times are preferably set by turning the remote plasma generator on and off. In some embodiments, the RF power of the processing tool used to perform combinatorial processing is any value or range of values between about 50 W and about 2000 W. The RF power frequency may be any value or range of values between about 40 kHz and about 60 MHz. It will be appreciated that the RF power frequency may be less than about 40 kHz or greater than about 60 MHz.

Wafer precleaning, contaminant removal, and photoresist removal may be performed using an oxygen plasma from a remote plasma source. A typical HPC experiment for contaminant removal comprises treating site-isolated regions of a substrate over a range of source gases for the plasma generator, plasma filtering parameters, exposure times, gas flow rates, frequencies, plasma generator powers, plasma generation methods, chamber pressures, substrate temperatures, distances between plasma source and substrate, substrate bias voltages, or combinations thereof.

Many materials such as silicon and many metals tend to form a native oxide when exposed at room temperature at standard atmospheric conditions. This native oxide may be removed using a fluorine or other halogen plasma source.

A typical HPC experiment for native oxide removal comprises treating site-isolated regions of a substrate over a range of source gases for the plasma generator, plasma filtering parameters, exposure times, gas flow rates, frequencies, plasma generator powers, plasma generation methods, chamber pressures, substrate temperatures, distances between plasma source and substrate, substrate bias voltages, or combinations thereof.

Remote plasma sources may also be used for a variety of additive processes such as a plasma-enhanced ALD process. Oxide layers may be created by exposing a layer on a substrate to an oxygen-containing plasma (oxidation). Nitride layers may be created by exposing a layer on a substrate to a nitrogen-containing plasma (nitridation). Hydrogen may be added to a layer on a substrate by exposing the layer to a hydrogen plasma (hydridation). Typical HPC experiments for such layer formation tasks comprise exposing site-isolated regions of a substrate over a range of substrate temperatures, exposure times, chamber pressure, ion energies, gas flow rates, and choice of plasma type and plasma power. The remote plasma sources may be used for surface treatments that reduce roughness, enable atomic migration, cause surface annealing, etc. The treatment gases may also include $NH_3$.

Figure 6:
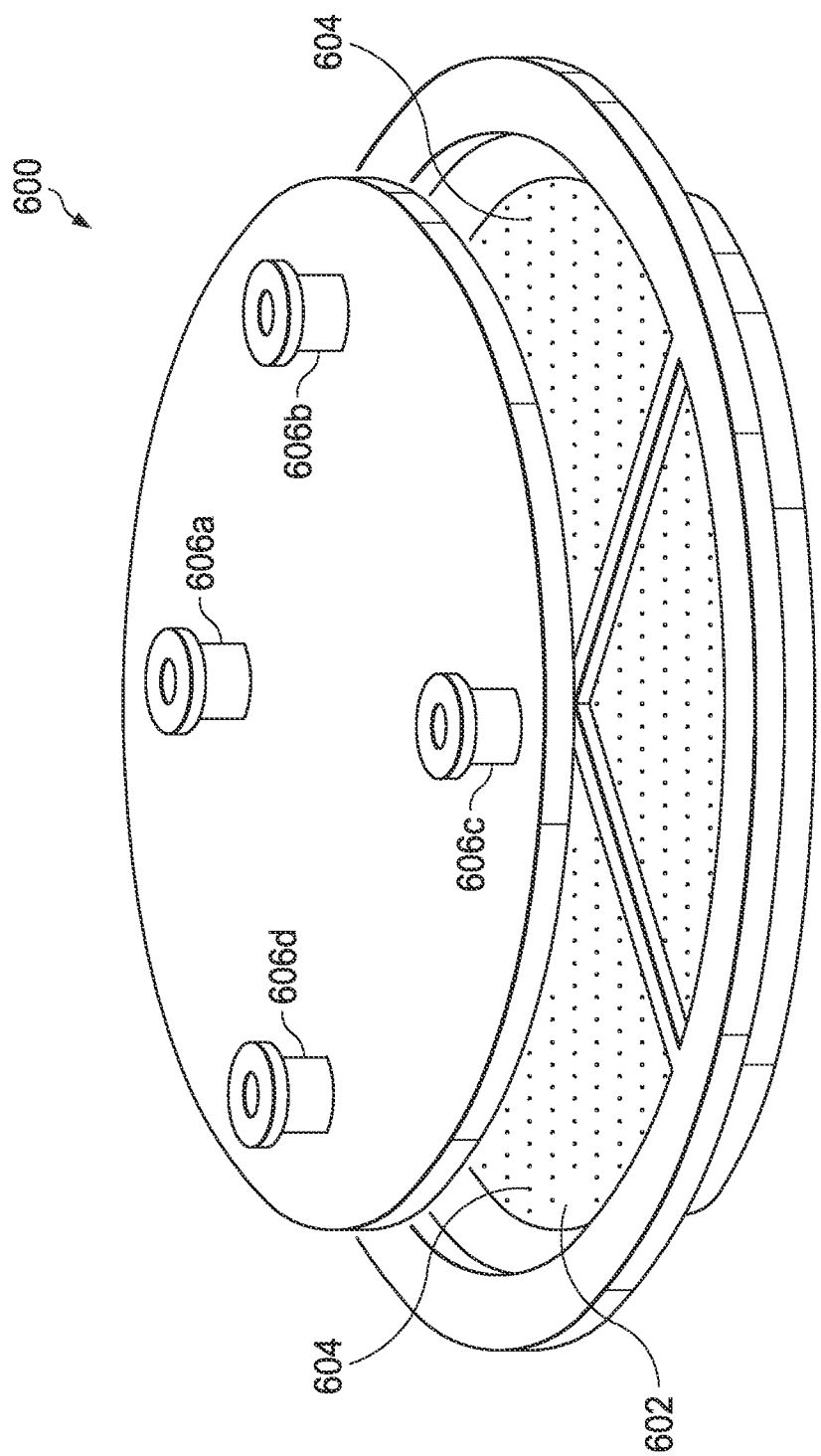
FIG. 6 illustrates an example of a large area ALD or CVD showerhead used for combinatorial processing.

FIG. 6 illustrates an example of a large area ALD or CVD showerhead 600 used for combinatorial processing. Details of this type of showerhead and its use may be found in U.S. patent application Ser. No. 12/013,729 entitled "Vapor Based Combinatorial Processing" filed on Jan. 14, 2008 and claiming priority to Provisional Application No. 60/970,199 filed on Sep. 5, 2001; U.S. patent application Ser. No. 12/013,759 entitled "Vapor Based Combinatorial Processing" filed on Jan. 14, 2008 and claiming priority to Provisional Application No. 60/970,199 filed on Sep. 5, 2001; and U.S. patent application Ser. No. 12/205,578 entitled "Vapor Based Combinatorial Processing" filed on Sep. 5, 2008 which is a Continuation Application of the U.S. patent application Ser. No. 12/013,729 and claiming priority to Provisional Application No. 60/970,199 filed on Sep. 5, 2001, all of which are herein incorporated by reference for all purposes.

The large area ALD or CVD showerhead, 600, illustrated in FIG. 6 comprises four regions, 602, used to deposit materials on a substrate. As an example, in the case of a round substrate, four different materials and/or process conditions could be used to deposit materials in each of the four quadrants of the substrate (not shown). Precursor gases, reactant gases, purge gases, etc. are introduced into each of the four regions of the showerhead through gas inlet conduits 606a-606d. For simplicity, the four regions, 602, of showerhead, 600, have been illustrated as being a single chamber. Those skilled in the art will understand that each region, 602, of showerhead, 600, may be designed to have two or more isolated gas distribution systems so that multiple reactive gases may be kept separated until they react at the substrate surface. Also for simplicity, only a single gas inlet conduit, 606a-606d, is illustrated for each of the four regions. Those skilled in the art will understand that each region, 602, of showerhead, 600, may have multiple gas inlet conduits. The gases exit each region, 602, of showerhead, 600, through holes, 604, in the bottom of the showerhead. The gases then travel to the substrate surface and react at the surface to deposit a material, etch an existing material on the surface, clean contaminants found on the surface, react with the surface to modify the surface in some way, etc. The showerhead illustrated in FIG. 6 is operable to be used with any ALD or plasma enhanced ALD technology.

As discussed previously, showerhead, 600, in FIG. 6 results in a deposition (or other process type) on a relatively large region of the substrate. In this example, a quadrant of the substrate. To address the limitations of the combinatorial showerhead illustrated in FIG. 6, small spot showerheads have been designed—see FIG. 7.

Figure 7:
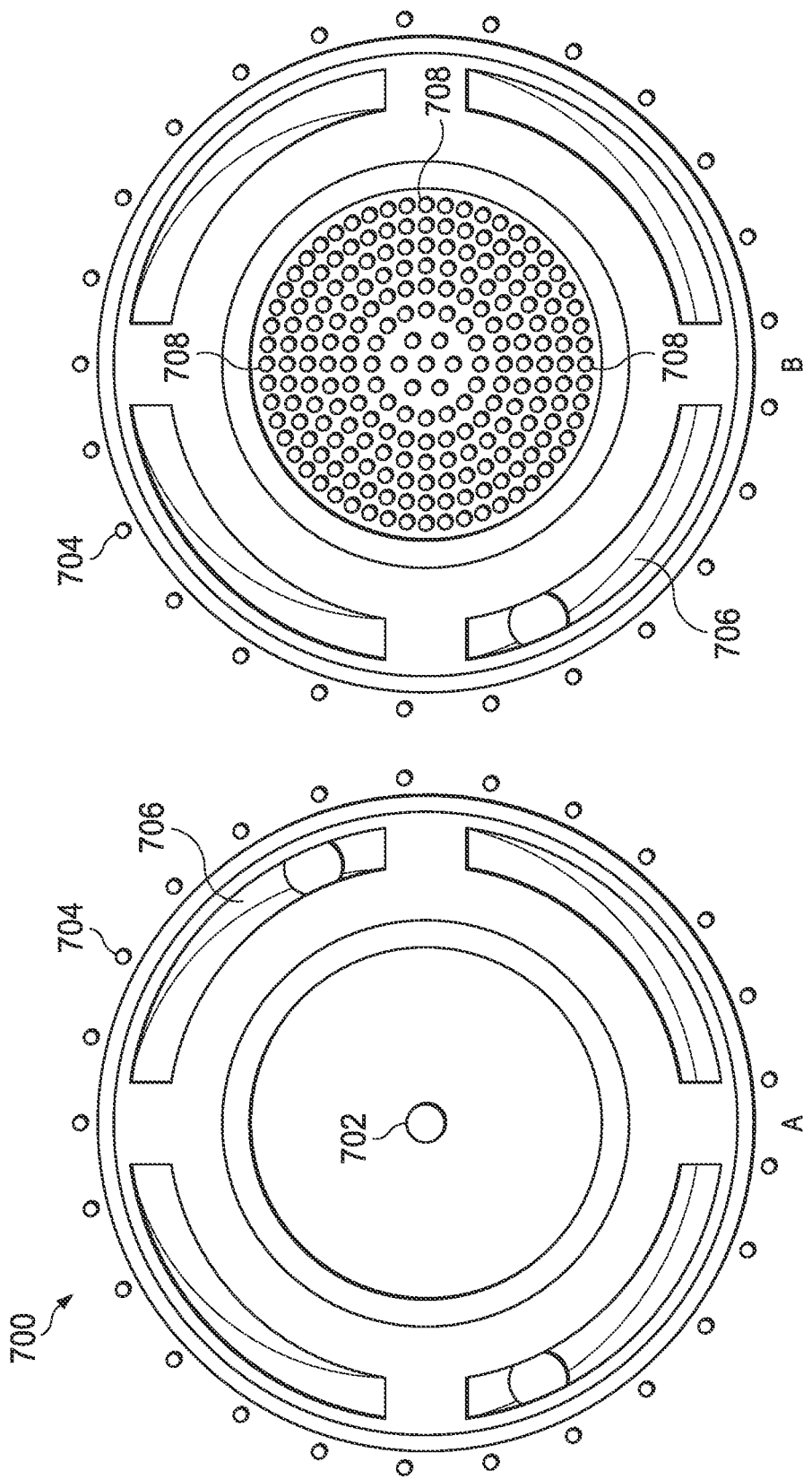
FIG. 7 illustrates a bottom view of two examples of a small spot showerhead apparatus.

FIG. 7 illustrates a bottom view of two examples of a small spot showerhead apparatus 700. The small spot showerhead configuration, A, illustrated in FIG. 7 comprises a single gas distribution port, 702, in the center of the showerhead for delivering reactive gases to the surface of the substrate. The small size of the small spot showerhead and the behavior of the technologies envisioned to use this showerhead ensure that the uniformity of the process on the substrate is adequate using the single gas distribution port. However, the small spot showerhead configuration, B, illustrated in FIG. 7 comprises a plurality of gas distribution ports, 708, for delivering reactive gases to the surface of the substrate. This configuration may be used to improve the uniformity of the process on the substrate if required.

Each small spot showerhead is surrounded by a plurality of purge holes, 704. The purge holes introduce inert purge gases (e.g. Ar, $N_2$, etc.) around the periphery of each small spot showerhead to insure that the regions under each showerhead may be processed in a site isolated manner. The gases, both the reactive gases and the purge gases, are exhausted from the process chamber through exhaust channels, 706, that surround each of the showerheads. The combination of the purge holes, 704, and the exhaust channels, 706, ensure that each region under each showerhead may be processed in a site-isolated manner. The diameter of the small spot showerhead (i.e. the diameter of the purge ring) may vary between about 40 mm and about 100 mm. Advantageously, the diameter of the small spot showerhead is about 65 mm.

Using a plurality of small spot showerheads as illustrated in FIG. 7 allows a substrate to be processed in a combinatorial manner wherein different parameters may be varied as discussed above. Examples of the parameters comprise process material composition, process material amounts, reactant species, processing temperatures, processing times, processing pressures, processing flow rates, processing powers, processing reactant compositions, the rates at which the reactions are quenched, atmospheres in which the processes are conducted, an order in which materials are deposited, etc.

Figure 8:
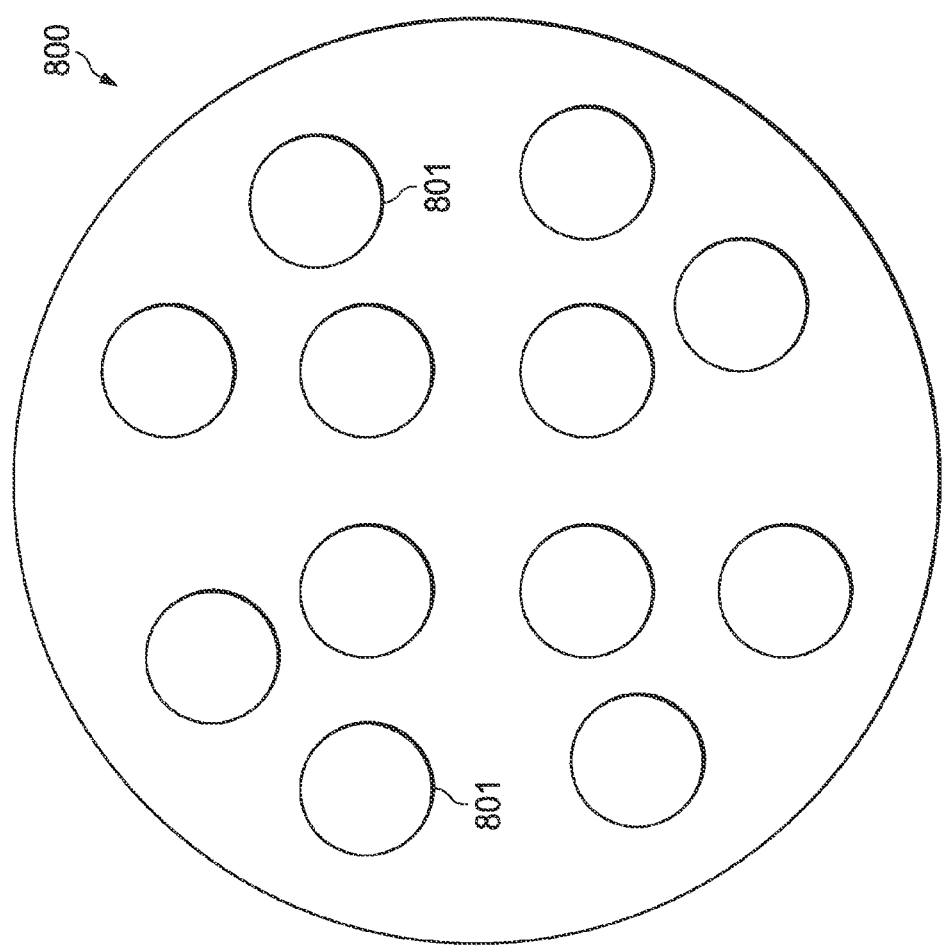
FIG. 8 illustrates one example of a pattern of site-isolated regions that may be processed using a small spot showerhead apparatus.

FIG. 8 illustrates one example of a pattern of site-isolated regions that may be processed using a small spot showerhead apparatus 700 shown in FIG. 7. In FIG. 8, the substrate is still generally divided into four quadrants and within each quadrant, three site-isolated regions may be processed using small spot showerheads as illustrated in FIG. 8, yielding twelve site-isolated regions on the substrate. Therefore, in this example, twelve independent experiments could be performed on a single substrate.

Figure 9A:
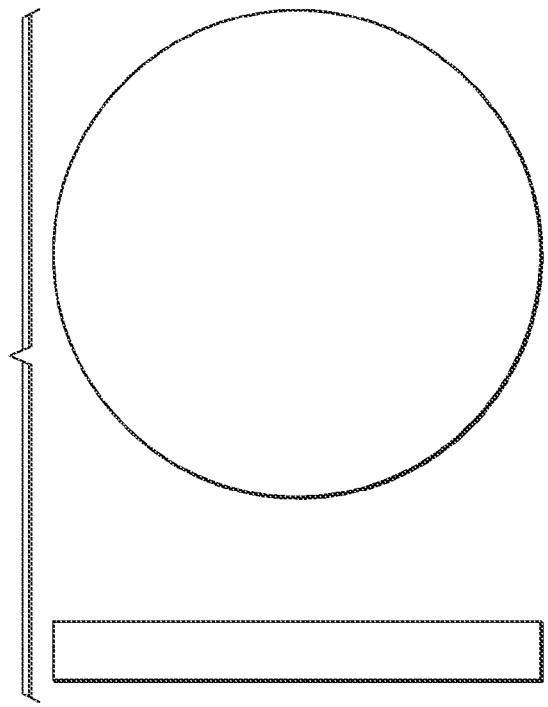
FIGS. 9A-9D illustrate an exemplary deposition sequence for forming multilayer film stacks.

FIGS. 9A-9D illustrates an exemplary deposition sequence for forming multilayer film stacks. A sequence for forming a simple multilayer film stack comprising a substrate, a treated dielectric material, and an electrode material to form a simple capacitor stack will be used as an example. Those skilled in the art will understand that the substrate may already have several layers comprising conductive layers, dielectric layers, or both deposited thereon. FIG. 9A begins with the substrate, wherein the substrate (or a previous material deposited thereon) is operable as a first electrode of the capacitor stack.

Figure 9B:
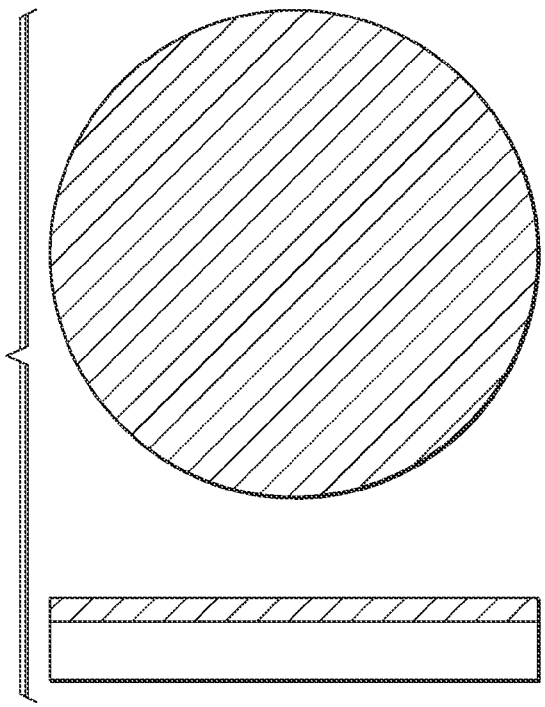

FIG. 9B illustrates a first material is formed above the substrate wherein the first material is operable as a dielectric of a capacitor stack. As illustrated in FIG. 9B, the first material is uniformly formed across the substrate surface. This may be accomplished using a conventional deposition chamber or may be accomplished using a combinatorial deposition chamber. If a combinatorial deposition chamber is used, then each of the large area showerhead sections, (i.e. as described previously), would be used to deposit the same material using the same process parameters. This results in a uniform formation of the first material.

In some embodiments, the first material is formed upon the substrate by a plasma enhanced ALD process. In some embodiments, plasma enhanced ALD may be considered a self-limiting process that uses two reactants. In some embodiments, the first reactant is a precursor (e.g., precursor A or B, such as a hafnium precursor to form a high-k dielectric film, and the second reactant is a plasma (e.g., oxygen plasma)). A typical plasma enhanced ALD cycle may include flowing the precursor into the processing chamber to form a first film as shown in FIG. 9B.

Figure 9C:
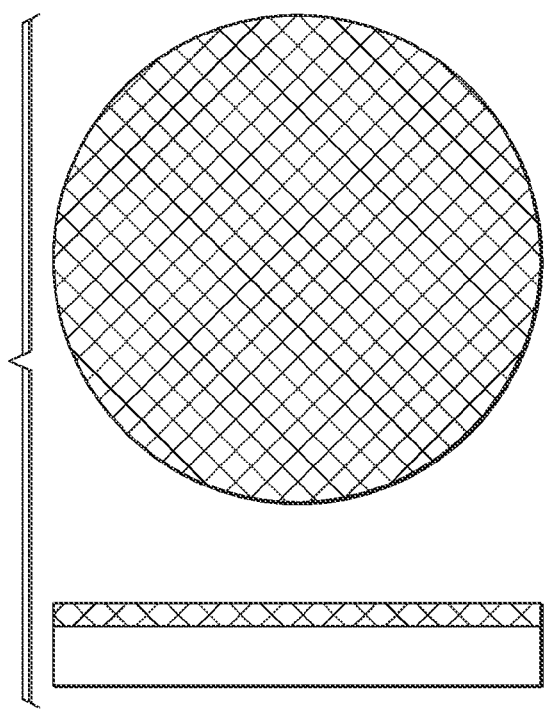

Next, purging excess precursor from the processing chamber and reacting the second reactant with the precursor to deposit a treated monolayer on a substrate as shown in FIG. 9C. In some embodiments, the monolayer is treated with fluorine-containing gas or a nitrogen-containing gas. Further, reacting the second reactant with the first reactant may be considered a doping step serving to introduce a treating material within the monolayer formed on the substrate according to some embodiments of the present disclosure.

Next, subsequently purging any excess second reactant from the processing chamber. In some embodiments, additional monolayers may be deposited by repeating the cycle. In some embodiments, a sub-monolayer or additional monolayers are deposited in a cycle.

Ex situ application of plasma may be performed using a remote plasma source that generates ions, atoms, radicals and other plasma species. The plasma species from the remote plasma source are provided to the substrate using the fluid supply system. The remote plasma source receives a gas (i.e., a plasma gas) such as oxygen, hydrogen, ammonia, or argon and generates plasma species such as radicals, ions, atoms, etc. The remote plasma source may be any type of plasma source such as a radio frequency, microwave, or electron cyclotron resonance (ECR) upstream plasma source.

The fluid supply system may deliver fluids from multiple sources. For example, one or more precursors may be simultaneously or sequentially provided to one or more site-isolated regions the substrate. When using a plasma enhanced ALD system, the precursor and the plasma are both reactants that are reacted to form layers on the substrate. Ex situ plasma may be differentially applied by flowing plasma species to some of the site-isolated regions and not to others or by using different plasma characteristics or parameters for various regions.

Figure 9D:
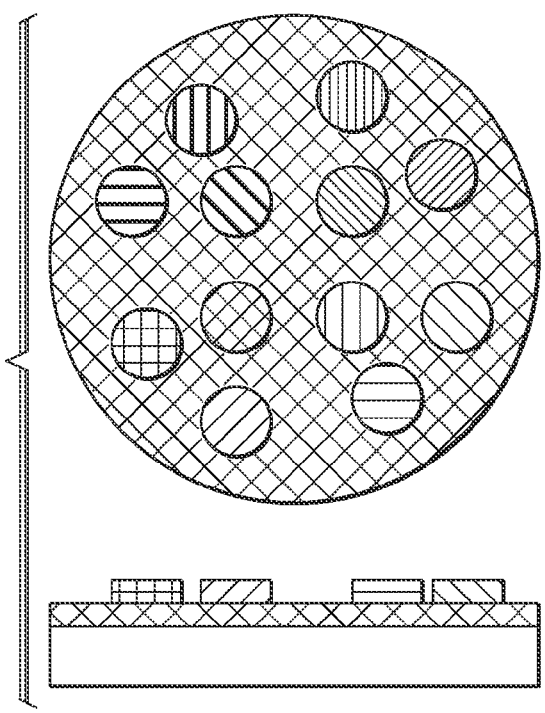

In FIG. 9D, multiple alternatives of a second material are formed above the first material wherein the second material is operable as the second electrode of a capacitor stack. As illustrated in FIG. 9D, the second material is deposited in small spots using a plurality of the small spot showerhead apparatus described in detail in U.S. patent application Ser. No. 13/341,993 which is herein incorporated by reference for all purposes. Advantageously, the plurality of small spot showerhead apparatus is integrated into large area, quadrant showerheads as described previously.

FIG. 9D illustrates twelve electrode experiments. They may represent the combinatorial variation of precursor chemicals, reactant chemicals, precursor/reactant delivery conditions (i.e. flow rates, pressure, pulse times, etc.), electrode thickness, substrate temperature, etc. Each of the twelve capacitors would then be tested to determine the optimum material and/or processing conditions. Typical tests may comprise measuring capacitance as a function of applied voltage (i.e. C-V curve), measuring current as a function of applied voltage (i.e. I-V curve), measuring the k value of the dielectric material, measure the equivalent oxide thickness (EOT) of the dielectric material, measuring the concentration and energy levels of traps or interface states, measuring the concentration and mobility of charge carriers, etc.

Figure 10A:
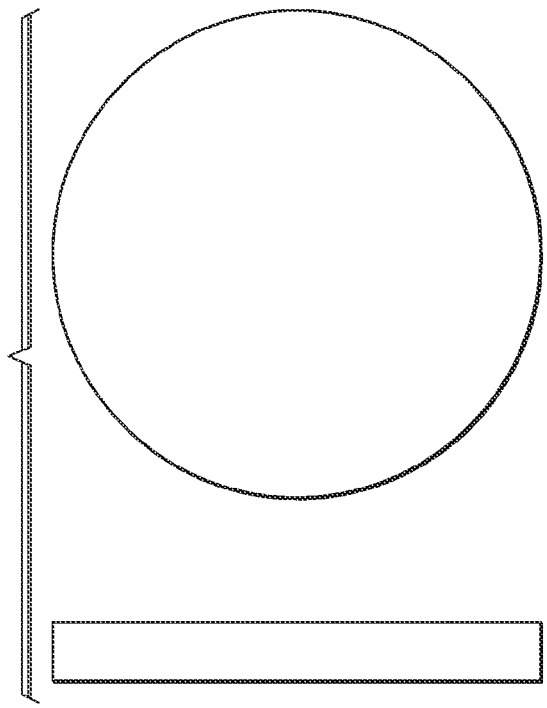
FIGS. 10A-10D illustrate an exemplary deposition sequence for forming multilayer film stacks.

FIGS. 10A-10D illustrates an exemplary deposition sequence for forming multilayer film stacks. A sequence for forming a simple multilayer film stack comprising a substrate, a treated dielectric material, and an electrode material to form a simple capacitor stack will be used as an example. Those skilled in the art will understand that the substrate may already have several layers comprising conductive layers, dielectric layers, or both deposited thereon. FIG. 10A begins with the substrate, wherein the substrate (or a previous material deposited thereon) is operable as a first electrode of the capacitor stack.

Figure 10B:
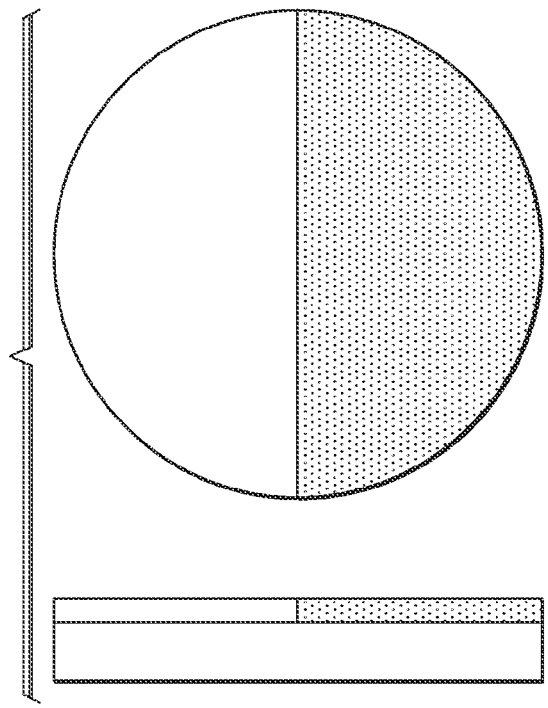

In FIG. 10B, two alternatives of a first material are formed above the substrate wherein the first material is operable as a dielectric of a capacitor stack. As illustrated in FIG. 10B, the two alternatives are formed in each of two sections across the substrate surface respectively. This may be accomplished using a combinatorial deposition chamber. In the combinatorial deposition chamber, two of the large area showerhead sections, (i.e. as described previously), would be used to deposit the first alternative on one half of the substrate using the same process parameters, and the other two of the large area showerhead sections, (i.e. as described previously), would be used to deposit the second alternative on the other half of the substrate using the same process parameters.

In some embodiments, the first material is formed upon the substrate by a plasma enhanced ALD process. In some embodiments, plasma enhanced ALD may be considered a self-limiting process that uses two reactants. In some embodiments, the first reactant is a precursor (e.g., precursor A or B, such as a hafnium precursor to form a high-k dielectric film, and the second reactant is a plasma (e.g., oxygen plasma). A typical plasma enhanced ALD cycle may include flowing the precursor into the processing chamber to form a first film as shown in FIG. 10B.

Figure 10C:
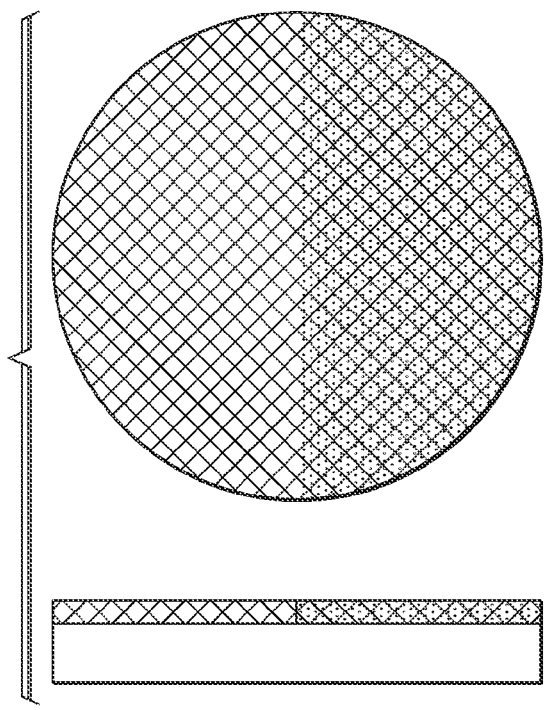

Next, purging excess precursor from the process chamber and reacting the second reactant with the precursor to deposit a treated monolayer on a substrate as shown in FIG. 10C. In some embodiments, the monolayer is treated of fluorine-containing gas or a nitrogen-containing gas. Further, reacting the second reactant with the first reactant may be considered a doping step serving to introduce a material within the monolayer formed on the substrate according to embodiments of the present disclosure.

Next, subsequently purging any excess second reactant from the process chamber. In some embodiments, a treated monolayer is deposited on the substrate such as but not limited to a fluorinated monolayer or a nitrided monolayer. Additional monolayers may be deposited by repeating the cycle. In some embodiments, a sub-monolayer or additional monolayers are deposited in a cycle.

Ex situ application of plasma may be performed using a remote plasma source that generates ions, atoms, radicals and other plasma species. The plasma species from the remote plasma source are provided to the substrate using the fluid supply system. The remote plasma source receives a gas (i.e., a plasma gas) such as oxygen, hydrogen, ammonia, or argon and generates plasma species such as radicals, ions, atoms, etc. The remote plasma source may be any type of plasma source such as a radiofrequency, microwave, or electron cyclotron resonance (ECR) upstream plasma source.

The fluid supply system may deliver fluids from multiple sources. For example, one or more precursors may be simultaneously or sequentially provided to one or more site-isolated regions the substrate. When using a plasma enhanced ALD system, the precursor and the plasma are both reactants that are reacted to form layers on the substrate. Ex situ plasma may be differentially applied by flowing plasma species to some of the site-isolated regions and not to others or by using different plasma characteristics or parameters for various regions.

Figure 10D:
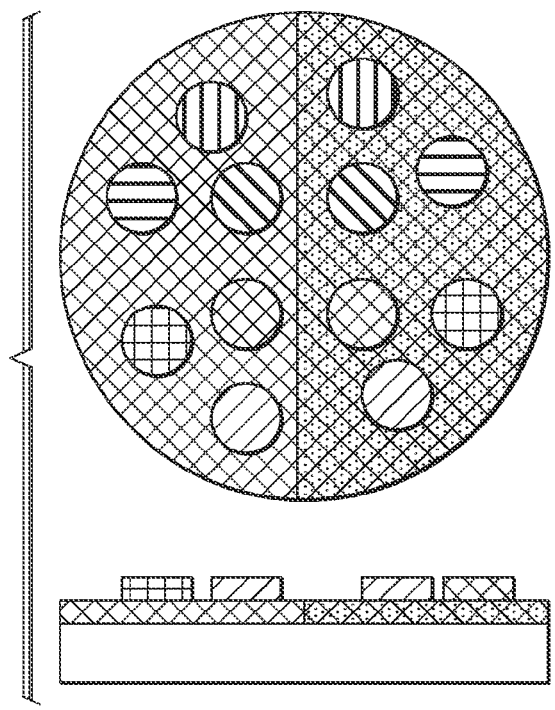

In FIG. 10D, multiple alternatives of a second material are formed above the first material wherein the second material is operable as the second electrode of the capacitor stack. As illustrated in FIG. 10D, the second material is deposited in small spots using a plurality of the small spot showerhead apparatus described previously. Advantageously, the plurality of small spot showerhead apparatus are integrated into large area, quadrant showerheads as described previously.

FIG. 10D illustrates twelve capacitor experiments. They may represent the combinatorial variation of precursor chemicals, reactant chemicals, precursor/reactant delivery conditions (i.e. flow rates, pressure, pulse times, etc.), electrode thickness, substrate temperature, etc. Each of the twelve capacitors would then be tested to determine the optimum material and/or processing conditions. Typical tests may comprise measuring capacitance as a function of applied voltage (i.e. C-V curve), measuring current as a function of applied voltage (i.e. I-V curve), measuring the k value of the dielectric material, measure the equivalent oxide thickness (EOT) of the dielectric material, measuring the concentration and energy levels of traps or interface states, measuring the concentration and mobility of charge carriers, etc.

Figure 11A:
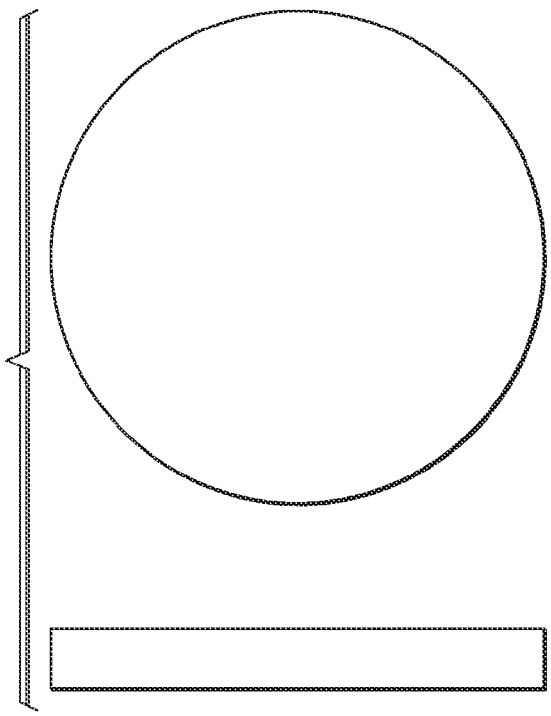
FIGS. 11A-11D illustrate an exemplary deposition sequence for forming multilayer film stacks.

FIGS. 11A-11D illustrates an exemplary deposition sequence for forming multilayer film stacks. A sequence for forming a simple multilayer film stack comprising a substrate, a treated dielectric material, and an electrode material to form a simple capacitor stack will be used as an example. Those skilled in the art will understand that the substrate may already have several layers comprising conductive layers, dielectric layers, or both deposited thereon. FIG. 11A begins with a substrate, wherein the substrate (or a previous material deposited thereon) is operable as a first electrode of the capacitor stack.

Figure 11B:
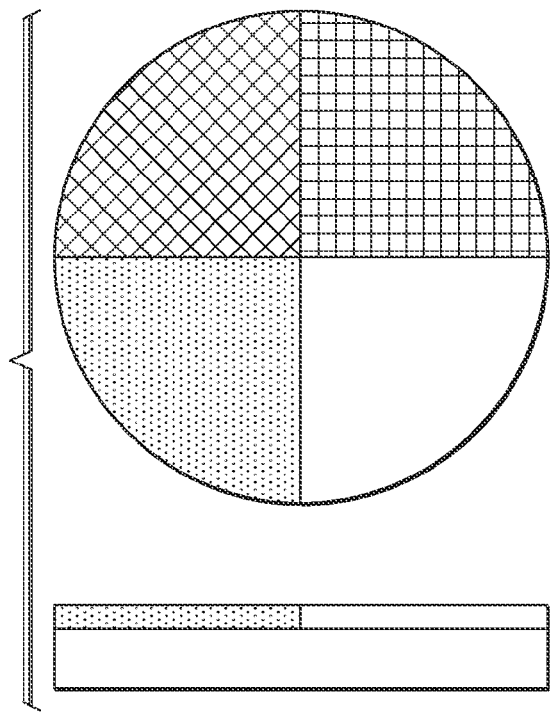

In FIG. 11B, four alternatives of a first material are formed above the substrate wherein the first material is operable as a dielectric of a capacitor stack. As illustrated in FIG. 11B, the four alternatives are formed in each of four sections across the substrate surface respectively. This may be accomplished using a combinatorial deposition chamber. In the combinatorial deposition chamber, each of the large area showerhead sections, (i.e. as described previously), would be used to deposit one of the four alternatives on the substrate.

In some embodiments, the first material is formed upon the substrate by a plasma enhanced ALD process. In some embodiments, plasma enhanced ALD may be considered a self-limiting process that uses two reactants. In some embodiments, the first reactant is a precursor (e.g., precursor A or B, such as a hafnium precursor to form a high-k dielectric film, and the second reactant is a plasma (e.g., oxygen plasma). A typical plasma enhanced ALD cycle may include flowing the precursor into the processing chamber to form a first film as shown in FIG. 11B.

Figure 11C:
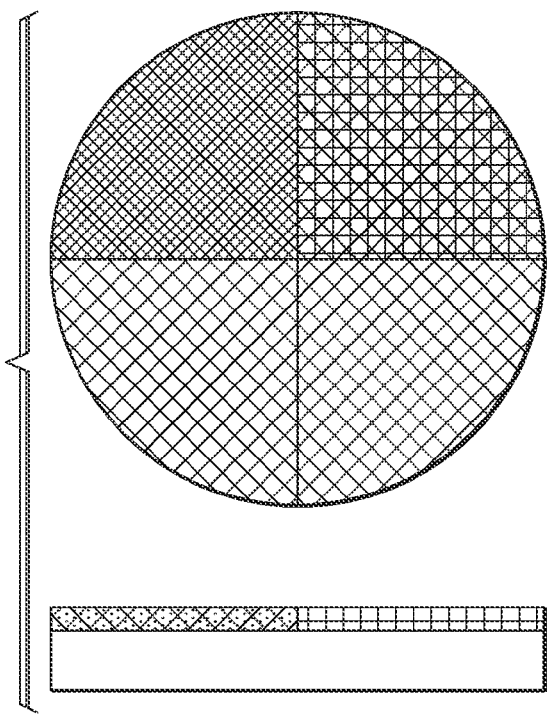

Next, purging excess precursor from the process chamber and reacting the second reactant with the precursor to deposit a treated monolayer on a substrate as shown in FIG. 11C. In some embodiments, the monolayer is treated of fluorine-containing gas or a nitrogen-containing gas. Further, reacting the second reactant with the first reactant may be considered a doping step serving to introduce a material within the monolayer formed on the substrate according to embodiments of the present disclosure.

Next, subsequently purging any excess second reactant from the process chamber. In some embodiments, a treated monolayer is deposited on the substrate such as but not limited to a fluorinated monolayer or a nitrided monolayer. Additional monolayers may be deposited by repeating the cycle. In some embodiments, a sub-monolayer or additional monolayers are deposited in a cycle.

Ex situ application of plasma may be performed using a remote plasma source that generates ions, atoms, radicals and other plasma species. The plasma species from the remote plasma source are provided to the substrate using the fluid supply system. The remote plasma source receives a feed gas (i.e., a plasma gas) such as oxygen, hydrogen, ammonia, or argon and generates plasma species such as radicals, ions, atoms, etc. The remote plasma source may be any type of plasma source such as a radio frequency, microwave, or electron cyclotron resonance (ECR) upstream plasma source.

The fluid supply system may deliver fluids from multiple sources. For example, one or more precursors may be simultaneously or sequentially provided to one or more site-isolated regions of the substrate. When using a plasma enhanced ALD system, the precursor and the plasma are both reactants that are reacted to form layers on the substrate. Ex situ plasma may be differentially applied by flowing plasma species to some of the site-isolated regions and not to others or by using different plasma characteristics or parameters for various regions.

Figure 11D:
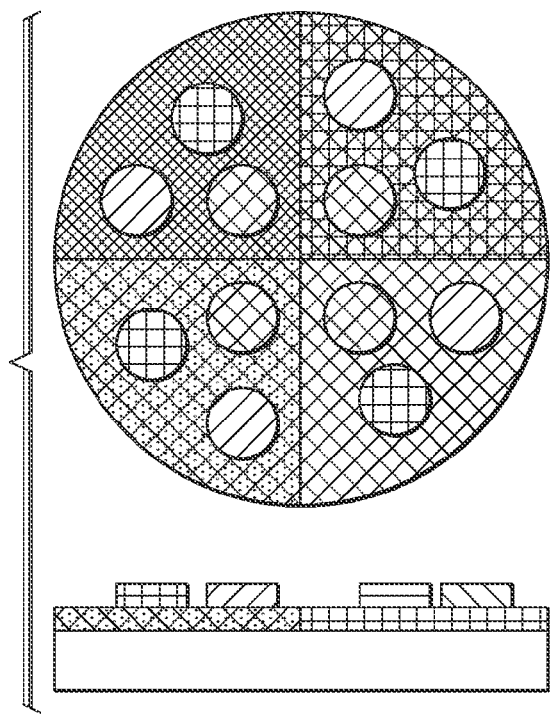

In FIG. 11D, multiple alternatives of a second material are formed above the first material wherein the second material is operable as the second electrode of the capacitor stack. As illustrated in FIG. 11D, the second material is deposited in small spots using a plurality of the small spot showerhead apparatus described previously. Advantageously, the plurality of small spot showerhead apparatus are integrated into large area, quadrant showerheads as described previously.

FIG. 11D, illustrates twelve capacitor experiments. They may represent the combinatorial variation of precursor chemicals, reactant chemicals, precursor/reactant delivery conditions (i.e. flow rates, pressure, pulse times, etc.), electrode thickness, substrate temperature, etc. Each of the twelve capacitors would then be tested to determine the optimum material and/or processing conditions. Typical tests may comprise measuring capacitance as a function of applied voltage (i.e. C-V curve), measuring current as a function of applied voltage (i.e. I-V curve), measuring the k value of the dielectric material, measure the equivalent oxide thickness (EOT) of the dielectric material, measuring the concentration and energy levels of traps or interface states, measuring the concentration and mobility of charge carriers, etc.

Figure 12:
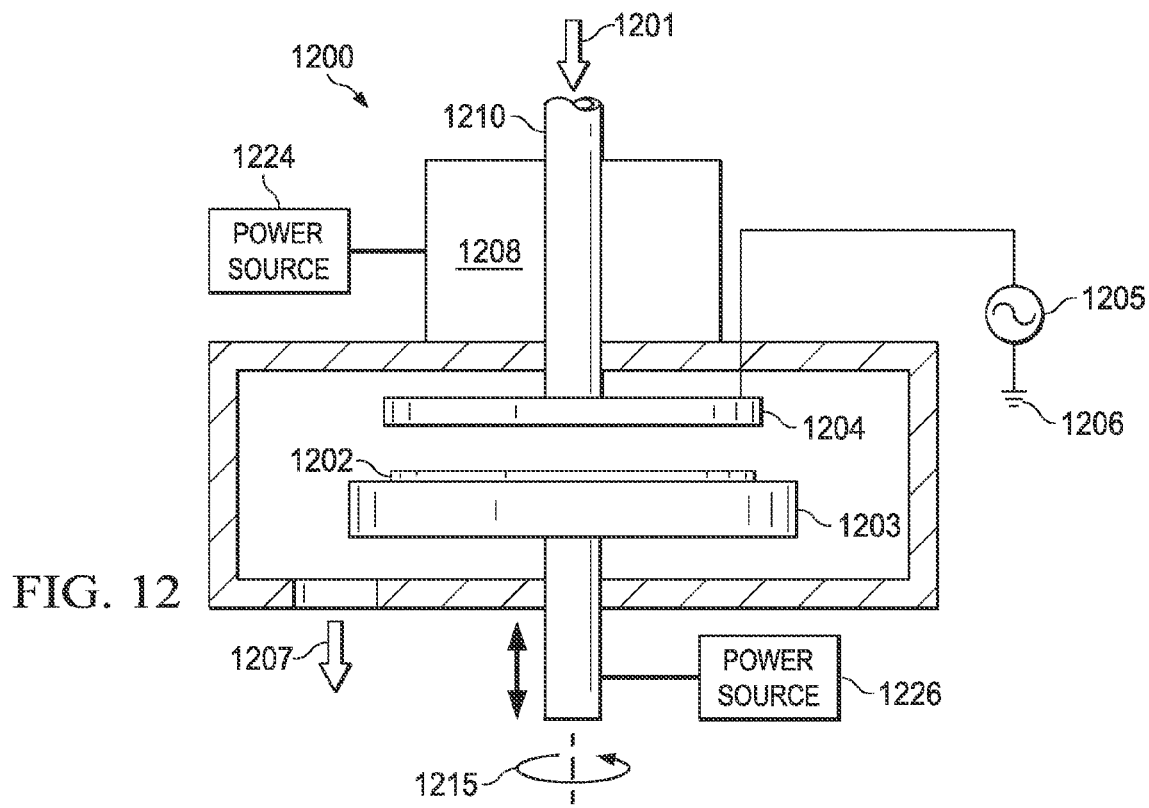
FIG. 12 shows an illustrative embodiment of an apparatus enabling combinatorial processing using a remote plasma source.

FIG. 12 shows an illustrative embodiment of an apparatus 1200 enabling combinatorial processing. In the embodiment shown, apparatus 1200 is a plasma enhanced ALD processing tool 1200 which includes a remote plasma source 1208. As shown, plasma enhanced ALD processing tool 1200 includes an inlet 1210 through which gas(es) are directed therethrough. As shown in the figure, the gas(es) flow in the direction of the arrow 1201. In some embodiments, inert gases, such as argon, ozone gas, and oxygen gas, are directed into inlet 1210. In some embodiments, other non-inert gases, such as, but not limited to high-k reactants, $NF_3$, $CF_4$, $F_2$, $NH_3$, and $N_2$ are directed into inlet 1210.

In some embodiments, plasma enhanced ALD processing tool 1200 includes a showerhead 1204 disposed over a substrate 1202 through which gas(es) flow therethrough to expose substrate 1202 within the processing chamber 1200. In addition, a radio frequency (RF) power source 1205 connected to ground 1206 is coupled to the showerhead component 1204 of the processing tool 1200. In addition, plasma enhanced ALD processing tool 1200 includes a substrate support assembly 1203 upon which substrate 1202 is supported thereon. Finally, plasma enhanced ALD processing tool 1200 may include a gas purge system that comprises at least one flow outlet 1207 located towards the bottom end of the processing tool 1200, as shown in the figure.

Notably, the dopant profile or concentration of the excited species used to treat a substrate, such as a wafer with a high-k dielectric material formed thereon, may be controlled by adjusting (or modulating) process parameters, such as pressure, gas flow rate, remote plasma power, the distance between remote plasma source and the substrate, and adding or removing a showerhead from the processing chamber.

The plasma enhanced ALD processing tool 1200 also includes power sources 1224 and 1226. In some embodiments, power source 1224 provides power for the remote plasma source 1208 and power source 1226 provides RF power to bias the substrate support 1203. In some embodiments, the output of the power source 1226 is synchronized with the output of power source 1224. The power source, 1224, may output a direct current (DC) power supply, a direct current (DC) pulsed power supply, a radio frequency (RF) power supply or a DC-RF imposed power supply. The power sources 1224 and 1226 may be controlled by a controller (not shown) so that deposition may be performed in the chamber of the processing tool 1200, as will be described in further detail hereinafter.

The plasma enhanced ALD processing tool 1200 further includes a substrate support 1204. The substrate support 1204 is capable of both rotating around its own central axis (referred to as "rotation" axis), and rotating about exterior axis 1215 (referred to as "revolution" axis). Such dual rotary substrate supports may be advantageous for combinatorial processing using site-isolated mechanisms. Other substrate supports, such as an XY table, may also be used for site-isolated deposition. In addition, substrate support 1203 may move in a vertical direction. It will be appreciated that substrate support's rotation and vertical movement may be achieved through one or more known drive mechanisms, including, for example, magnetic drives, linear drives, worm screws, lead screws, differentially pumped rotary feeds, and the like.

Figure 13:
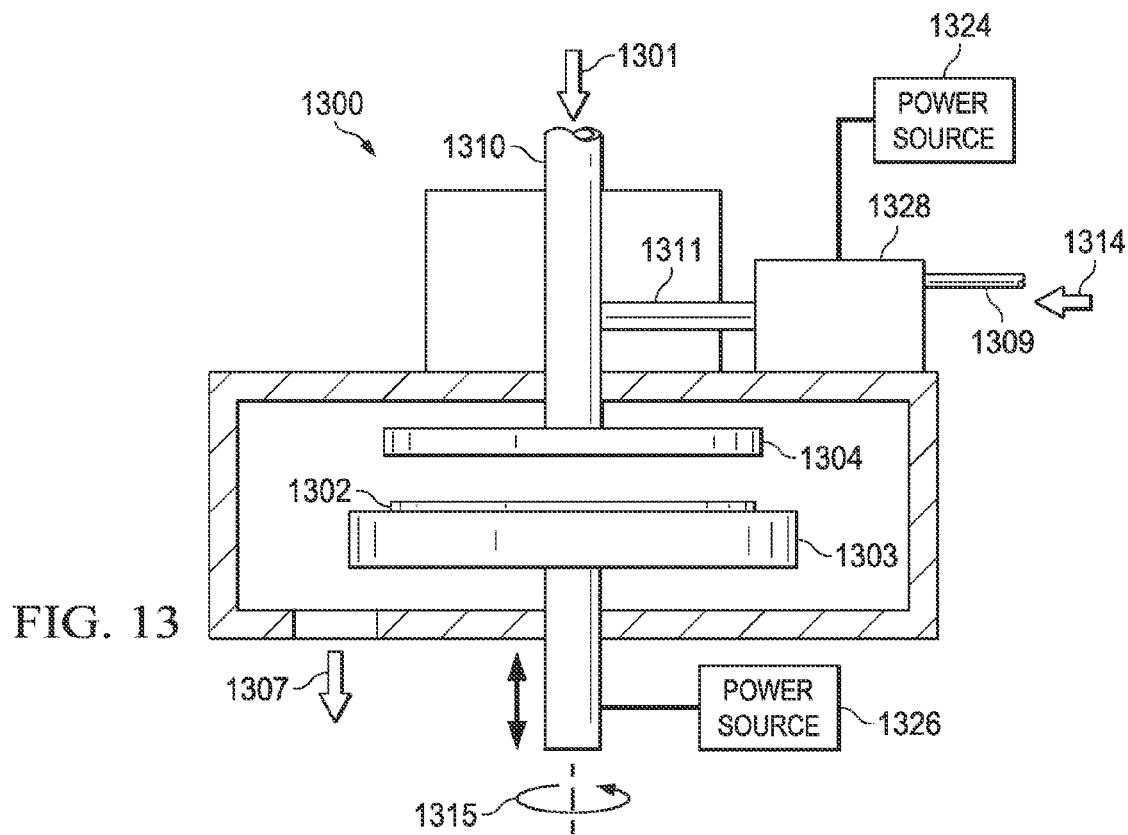
FIG. 13 shows another illustrative embodiment of an apparatus enabling combinatorial processing using a remote plasma source.

FIG. 13 shows another illustrative embodiment of an apparatus 1300 enabling combinatorial processing using a remote plasma source 1328. In some embodiments, apparatus 1300 is an ALD processing tool 1300 with direct plasma source 1328 and remote plasma source 1328. ALD processing tool 1300 includes a first inlet 1310 (through which gases flow therethrough in direction 1301), showerhead 1304, substrate support assembly 1303 (which may move vertically or rotate about axis 1315) with a substrate 1302 thereon, and power supplies 1324, 1326. In some embodiments, gas is introduced into processing tool 1300 through inlet 1310.

In addition, ALD processing tool includes a second inlet 1309 connected to a remote plasma source 1328. As described above, remote plasma source 1328 may be used for surface treatments that reduce roughness, enable atomic migration, cause surface annealing, etc. In some embodiments, second inlet 1309 facilitates gas(es) or reactive species to be introduced (in direction 1314) into the processing chamber 1300. In some embodiments, second inlet 1309 allows a reactive material, such as fluorine or nitrogen-containing gases, to be introduced into the processing tool 1300 via tube 1311 coupled to inlet 1310. Moreover, second inlet 1309 facilitates transport of inert gases as well into ALD processing tool 1300.

The plasma enhanced ALD processing tool 1300 also includes power sources 1324 and 1326. In some embodiments, power source 1324 provides power for the remote plasma source 1328 and power source 1326 provides RF power to bias the substrate support 1303. In some embodiments, the output of the power source 1326 is synchronized with the output of power source 1324. The power source, 1324, may output a direct current (DC) power supply, a direct current (DC) pulsed power supply, a radio frequency (RF) power supply or a DC-RF imposed power supply. The power sources 1324 and 1326 may be controlled by a controller (not shown) so that both deposition may be performed in the chamber of the processing tool 1300, as will be described in further detail hereinafter. Finally, plasma enhanced ALD processing tool 1300 may include a gas purge system that comprises at least one flow outlet 1307 located towards the bottom end of the processing tool 1300, as shown in the figure.

Figure 14:
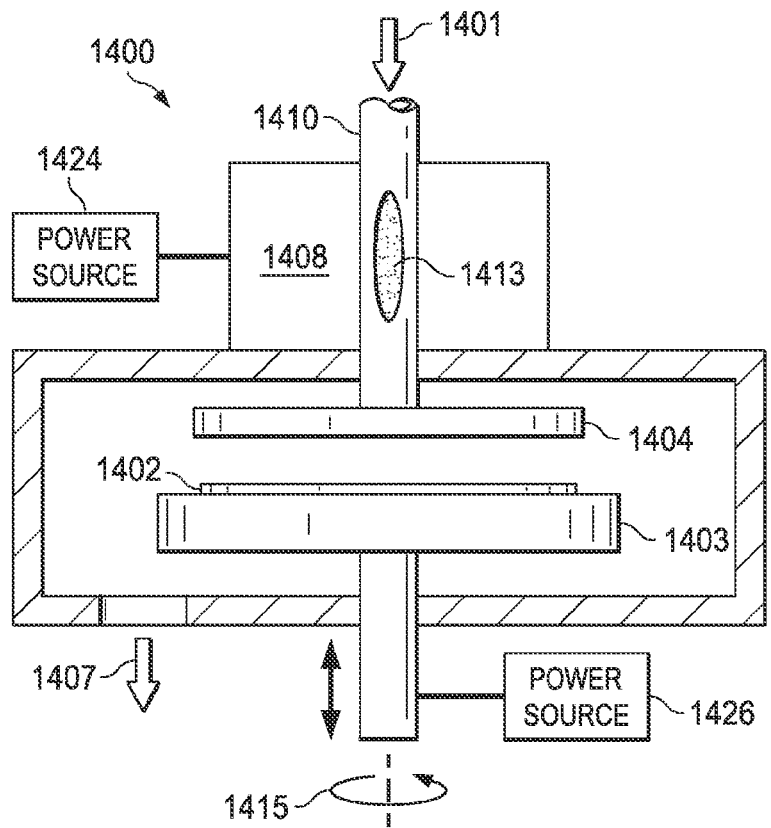
FIG. 14 shows yet another illustrative embodiment of an apparatus enabling combinatorial processing using a remote plasma source.

FIG. 14 shows yet another illustrative embodiment of an apparatus 1400 enabling combinatorial processing using a remote plasma source 1408. In the embodiment shown, apparatus 1400 is an ALD processing tool 1400 having a remote plasma source 1408. As shown, ALD processing tool 1400 includes many of the components illustrated in the apparatuses previously discussed. ALD processing tool 1400 includes a first inlet 1410 (through which gases are directed therethrough in direction 1401), showerhead 1404, substrate support assembly 1403 (which may move vertically or rotate about axis 1415) with a substrate 1402 thereon, and power supplies 1424, 1426.

In addition, remote plasma source 1408 is illustrated in the figure. In some embodiments, remote plasma source 1408 generates a plasma 1413 and reactive radicals, with or without some ions and electrons, are introduced into the plasma 1413 which flows onto substrate 1402 for a pre-specified treatment (e.g. fluorine or nitrogen treatments). For example, argon or other inert gas without other gases such as oxygen, and fluorine-containing gases, such as $NF_3$, $CF_4$, and $F_2$ are directly into the remote plasma source 1408. In some embodiments, the plasma chamber of the remote plasma source 1408 is made of ceramic, sapphire, or quartz material. Finally, plasma enhanced ALD processing tool 1400 may include a gas purge system that comprises at least one flow outlet 1407 located towards the bottom end of the processing tool 1400, as shown in the figure.

Figure 15:
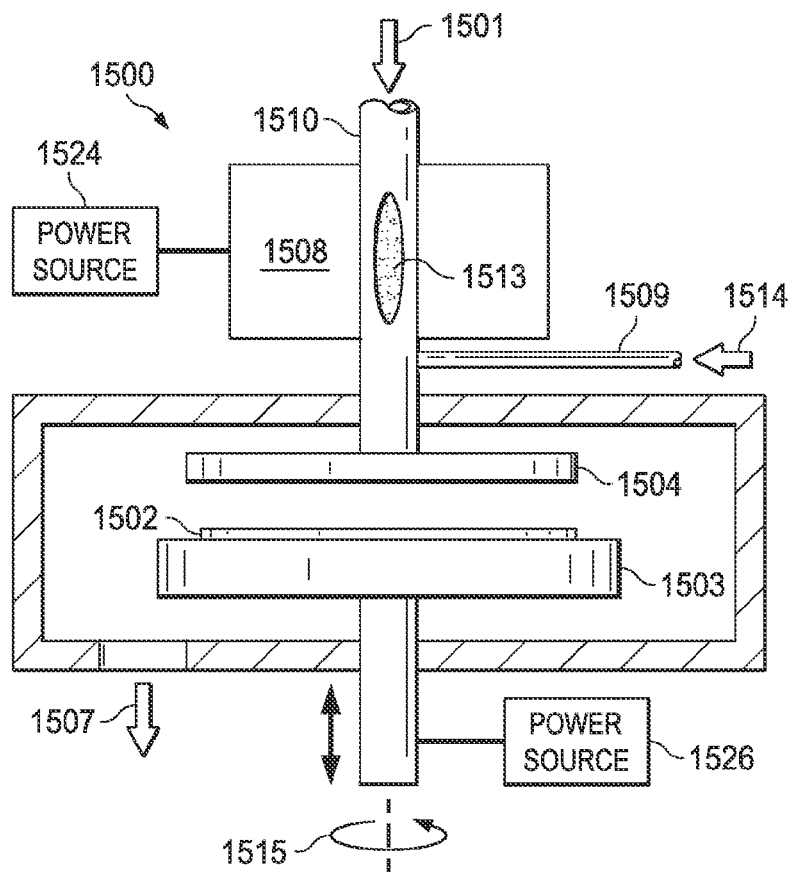
FIG. 15 shows yet a fourth illustrative embodiment of an apparatus enabling combinatorial processing using a remote plasma source.

FIG. 15 shows yet another illustrative embodiment of an apparatus 1500 enabling combinatorial processing using a remote plasma source 1508. In some embodiments, apparatus 1500 is an ALD processing tool 1500 having a remote plasma source 1508 that generates a plasma 1513 and an inlet 1501 through which gases are flown through (e.g. direction 1501). ALD processing tool 1500 has an additional inlet 1509 through which a gas is directed therethrough in direction 1514. In some embodiments, ALD processing chamber 1500 includes many of the components illustrated in the previous figures (power sources 1524, 1526 and substrate support 1503 upon which substrate 1502 rests and rotates about axis 1515).

In some embodiments, a remote plasma source 1508 is used to generate the required reactive species which are directed into the processing chamber 1500 during the treatment or doping step. The treatment may include fluorine radicals, nitrogen radicals, other element radicals, and any other inert gas mentioned above.

In FIG. 15, a source gas is directed downstream of the remote plasma source 1508 instead of being directed through the remote plasma source 1508. In some embodiments, weak fluorine ionization may be achieved to optimize the process for a fluorinated treatment by adjusting process parameters. Finally, plasma enhanced ALD processing tool 1500 may include a gas purge system that comprises at least one flow outlet 1507 located towards the bottom end of the processing tool 1500, as shown in the figure.

Methods and apparatuses for performing plasma treatment have been described. It will be understood that the descriptions of some embodiments of the present disclosure do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, some embodiments of the present invention may be practiced without these specific details.

What is claimed is:

1. A method for performing plasma treatments in a combinatorial manner, comprising:
   introducing a substrate into a processing chamber, wherein the substrate comprises a plurality of site-isolated regions;
   forming a first film on a surface of a first site-isolated region on the substrate;
   forming a second film on a surface of a second site-isolated region on the substrate;
   exposing the first film to a plasma having a first source gas to form a first treated film on the substrate without etching the first treated film in the processing chamber;
   exposing the second film to a plasma having a second source gas to form a second treated film on the substrate without etching the second treated film in the processing chamber;
   evaluating properties of the first treated film and the second treated film;
   forming a third film on the first film to form a first capacitive stack;
   forming a fourth film on the second film to form a second capacitive stack;
   wherein the third and fourth films are formed by flowing reactive gases through a plurality of gas distribution ports of a small spot showerhead apparatus;
   wherein the small spot showerhead apparatus has a diameter that is less than the diameter of the substrate such that the diameters of the third and fourth films provided by the small spot showerhead apparatus are less than the diameter of the substrate;
   forming a purge wall on the surface of the substrate during the forming of each of the third and fourth films, wherein the purge wall is external to the reactive gases flowing through the plurality of gas distribution ports, by flowing purge gases through a plurality of purge holes disposed around the periphery of the small spot showerhead apparatus thereby containing the reactive gases within the confines of the purge wall; and
   evaluating properties of the first capacitive stack and the second capacitive stack.

2. The method of claim 1, wherein the first and second films are treated with one of a fluorine-containing gas and a nitrogen-containing gas.

3. The method of claim 2, wherein the fluorine-containing gas comprises one of $NF_3$, $F_2$, $CF_4$, or combinations thereof.

4. The method of claim 2, wherein the nitrogen-containing gas comprises one of $NH_3$, $N_2$ or combinations thereof.

5. The method of claim 2, wherein the first film is formed by a plasma enhanced Atomic Layer Deposition (ALD) process.

6. The method of claim 2, wherein the plasma is created in a remote plasma source.

7. The method of claim 2, wherein the first treated film comprises hafnium and wherein the second treated film comprises zirconium.

8. The method of claim 1, wherein the first and second treated films are high-k dielectric films.

9. The method of claim 1 further comprising varying at least one of a radio frequency (RF) power, pressure, gas flow rate, or processing time in a combinatorial manner prior to forming the second treated film.

10. The method of claim 1, wherein evaluating properties comprises:
    characterizing each site-isolated region after treating the first film and the second film; and
    comparing a physical or electrical characteristic of the first film and the second film.

11. The method of claim 1 further comprising moving a substrate support within the processing chamber to a first position before forming the first treated film on the surface of the first site-isolated region on the substrate and moving the substrate support to a second position before forming the second treated film on the surface of the second site-isolated region on the substrate.

12. The method of claim 11 wherein moving the substrate support includes rotating the substrate support to a first position before forming the first treated film on the surface of the first site-isolated region of the substrate and rotating the substrate support to a second position before forming the second treated film on the surface of the second site-isolated region of the substrate.

* * * * *